United States Patent
Lee et al.

(10) Patent No.: US 8,872,093 B2
(45) Date of Patent: Oct. 28, 2014

(54) CALIBRATED IMAGE-SENSOR-BASED AMBIENT LIGHT SENSOR

(75) Inventors: Chiajen Lee, Irvine, CA (US); Anup Sharma, Sunnyvale, CA (US); Xiaofeng Fan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 282 days.

(21) Appl. No.: 13/449,842

(22) Filed: Apr. 18, 2012

(65) Prior Publication Data

US 2013/0278576 A1 Oct. 24, 2013

(51) Int. Cl.
*H01L 27/146* (2006.01)
*G09G 5/10* (2006.01)

(52) U.S. Cl.
USPC ............. 250/214 AL; 250/208.1; 348/191; 348/227.1; 345/207; 356/222

(58) Field of Classification Search
USPC ............. 250/214 AL, 214 R, 208.2, 208.1; 356/221, 222, 229, 213; 348/191, 348/226.1, 227.1; 345/207
See application file for complete search history.

(56) References Cited

U.S. PATENT DOCUMENTS

| | | | |
|---|---|---|---|
| 6,469,289 B1 * | 10/2002 | Scott-Thomas et al. ... | 250/208.1 |
| 7,071,456 B2 * | 7/2006 | Poplin ..................... | 250/214 AL |
| 7,683,305 B2 * | 3/2010 | Solhusvik et al. ......... | 250/208.1 |
| 7,714,265 B2 * | 5/2010 | Fadell et al. ............. | 250/214 AL |
| 7,728,316 B2 * | 6/2010 | Fadell et al. ............. | 250/559.38 |
| 7,737,394 B2 * | 6/2010 | Ovsiannikov et al. ...... | 250/226 |
| 7,800,044 B1 * | 9/2010 | Kahn et al. ............... | 250/214 AL |
| 7,960,807 B2 * | 6/2011 | Lin et al. ................. | 257/440 |
| 8,008,611 B2 * | 8/2011 | Kim et al. ................ | 250/208.1 |
| 8,076,631 B2 | 12/2011 | Tada et al. | |
| 8,138,463 B2 * | 3/2012 | Hadwen et al. ........... | 250/208.2 |
| 8,299,415 B2 * | 10/2012 | Onogi ..................... | 250/214 AL |
| 2005/0051708 A1 * | 3/2005 | Hotelling ................ | 250/214 AL |
| 2009/0084943 A1 * | 4/2009 | Solhusvik et al. ....... | 250/214 AL |
| 2010/0072351 A1 * | 3/2010 | Mahowald ............. | 250/214 AL |
| 2010/0096997 A1 * | 4/2010 | Ahn et al. .............. | 315/158 |
| 2010/0128010 A1 * | 5/2010 | Katoh et al. ............ | 345/207 |
| 2011/0068257 A1 * | 3/2011 | Maeda et al. ........... | 250/214 AL |
| 2011/0149137 A1 | 6/2011 | Koike | |

(Continued)

OTHER PUBLICATIONS

Stevens, Eric G., et al., "Session X: Image Sensors and Processing Circuits—WPM 10.5: A 1.4-Million-Element CCD Image Sensor", 1987 IEEE International Solid-State Circuits Conference, Wednesday, Feb. 25, 1987, Rhinelander South, 5:30 p.m., (pp. 114-116 and pp. 364-365).

*Primary Examiner* — John Lee
(74) *Attorney, Agent, or Firm* — Blakely, Sokoloff, Taylor & Zafman LLP

(57) ABSTRACT

An electronic device may be provided with an image sensor for capturing digital images. The image sensor may be used as part of image-sensor-based ambient light sensing circuitry for producing ambient light sensor readings. The image-sensor-based ambient light sensing circuitry may include a reference array. The reference array may be formed from an array of light sensor elements that are matched to elements in the image sensor but that are covered with a light blocking material. Control circuitry can measure current flow into the reference array and the image sensor array and can use current measurements from these arrays in producing a calibrated ambient light sensor reading. The control circuitry may make current measurements by measuring a decay time associated with the voltage of a discharging capacitor. A comparator, pulse generator, and switch may be used in periodically recharging the capacitor. The capacitor may be adjusted to ensure accurate readings.

18 Claims, 7 Drawing Sheets

(56) References Cited

U.S. PATENT DOCUMENTS

| | | | |
|---|---|---|---|
| 2011/0199349 A1* | 8/2011 | Katoh | 345/207 |
| 2011/0199518 A1 | 8/2011 | Zheng et al. | |
| 2013/0176291 A1* | 7/2013 | Leonard | 345/207 |
| 2013/0181112 A1* | 7/2013 | Richardson et al. | 250/208.1 |
| 2013/0206959 A1* | 8/2013 | Zhang | 250/208.1 |
| 2013/0214125 A1* | 8/2013 | Solhusvik et al. | 250/208.1 |
| 2013/0271438 A1* | 10/2013 | Aflatooni | 345/207 |
| 2013/0278576 A1* | 10/2013 | Lee et al. | 345/207 |
| 2013/0328842 A1* | 12/2013 | Barnhoefer et al. | 345/207 |
| 2013/0341494 A1* | 12/2013 | Fadell et al. | 250/214 AL |

* cited by examiner

CALIBRATED IMAGE-SENSOR-BASED AMBIENT LIGHT SENSOR

BACKGROUND

This relates generally to electronic devices, and more particularly, to image-sensor-based ambient light detection circuitry for electronic devices.

Electronic devices such as portable computers and cellular telephones are often provided with ambient light sensors. Ambient light sensors can be used to measure the amount of ambient light in the immediate vicinity of an electronic device. When ambient light conditions change, an electronic device may take appropriate actions. For example, display brightness levels may be adjusted to accommodate bright or dim lighting conditions.

Ambient light sensors are typically mounted under dedicated ambient light sensor windows in electronic device housings. The need for individual ambient light sensors and mounting arrangements can add undesired cost and complexity to an electronic device. Ambient light sensor windows may also detract from the appearance of an electronic device.

It would therefore be desirable to be able to provide improved ambient light detection circuitry for electronic devices.

SUMMARY

An electronic device may be provided with an image sensor for capturing digital images. The image sensor may be used as part of image-sensor-based ambient light sensing circuitry for producing ambient light sensor readings. Ambient light data from the image-sensor-based ambient light sensing circuitry may be used to make adjustments to display brightness or other adjustments during operation of the electronic device.

The image-sensor-based ambient light sensing circuitry may include a optically-black reference array. The reference array may be formed from an array of light sensing elements that are matched to active light-sensing elements in the image sensor but that are covered with a light blocking material.

Control circuitry can open and close switches to measure current flow into the reference array and the image sensor array. The current measurements from these arrays can be used in producing a calibrated ambient light sensor reading.

The control circuitry may make current measurements by measuring a decay time associated with the voltage of a capacitor that is discharged using current flowing into the reference array or image sensor array. A comparator, pulse generator, and switch may be used in periodically recharging the capacitor. The capacitor may be adjusted by the control circuitry.

Further features of the invention, its nature and various advantages will be more apparent from the accompanying drawings and the following detailed description of the preferred embodiments.

DETAILED DESCRIPTION

Figure 1:
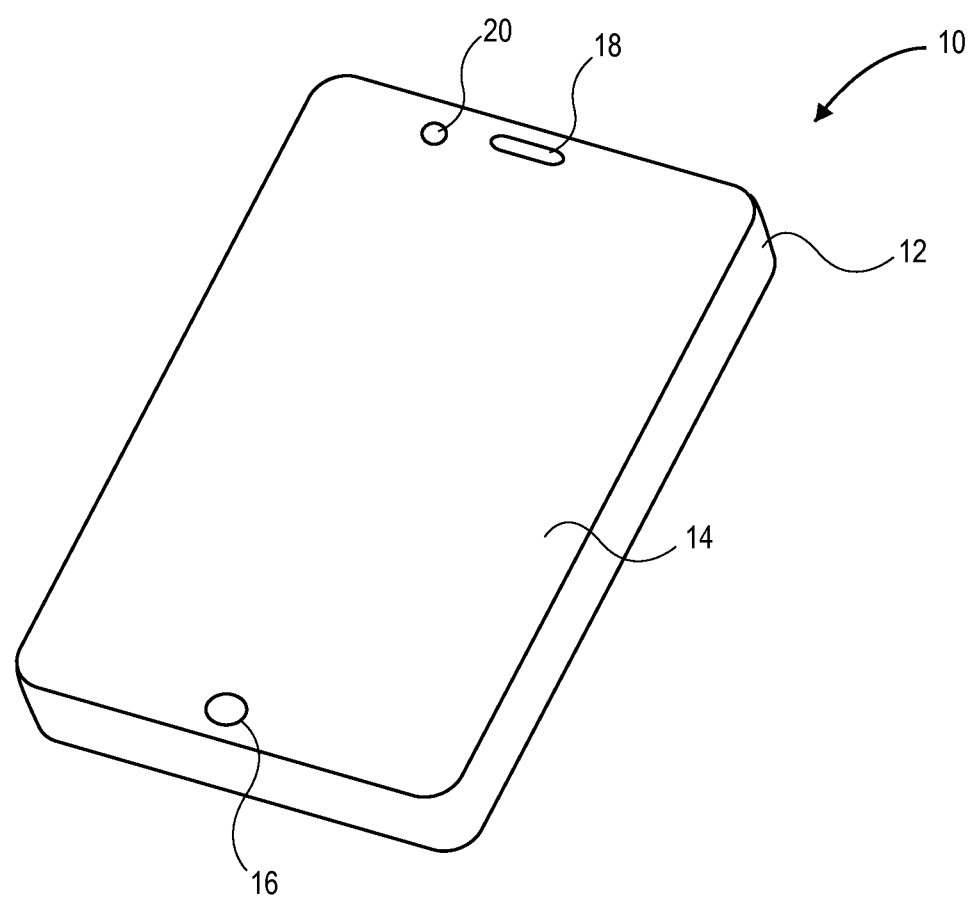
FIG. 1 is a perspective view of an illustrative electronic device with image-sensor-based ambient light sensing circuitry in accordance with an embodiment of the present invention.

Electronic devices such as electronic device 10 of FIG. 1 may be provided with ambient light sensor circuitry. The ambient light sensor circuitry may be used to support operations such as display brightness level adjustments and other operations in an electronic device. The ambient light sensor circuitry may use data that is gathered from an image sensor array and may therefore sometimes be referred to as image-sensor-based ambient light sensor circuitry.

Image-sensor-based ambient light sensor circuitry may be used in an electronic device such as electronic device 10 of FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, or a media player. Device 10 may also be a television, a set-top box, a desktop computer, a computer monitor into which a computer has been integrated, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. For example, glass structures, plastic structures, or other dielectric structures may be used to form exterior and interior portions of housing 12. In other situations, housing 12 or at least some of the structures that make up housing 12 may be formed from metal elements.

Device 10 may, if desired, have a display such as display 14. Display 14 may be a touch screen that incorporates a touch sensor array or may be insensitive to touch. A touch sensor array for display 14 may be formed from capacitive touch sensor electrodes or touch sensors based on other touch technologies (e.g., acoustic touch, light-based touch sensor configurations, force sensor arrangements, etc.). Display 14 may include image pixels formed from light-emitting diodes (LEDs), organic LEDs (OLEDs), plasma cells, electrowetting pixels, electrophoretic pixels, liquid crystal display (LCD) components, or other suitable image pixel structures. A display cover layer such as a clear plastic layer or transparent glass layer may cover the surface of display 14. Peripheral regions of the display cover layer may be provided with an internal opaque masking layer to help hide internal components from view by a user. Buttons such as button 16 may pass through openings in the cover layer. The cover layer may also have other openings such as an opening for speaker port 18.

One or more optically clear windows such as window 20 may be provided in device 10. Windows such as window 20 may be formed from glass or plastic elements that are mounted within an opening in an opaque housing structure or may be formed by creating an opening in an opaque masking layer on the underside of a display cover layer or other transparent member. In the example of FIG. 1, window 20 has been formed in a portion of the display cover layer for display 14 (e.g., by creating an opening in a peripheral opaque masking layer that overlaps inactive portions of display 14). If desired, windows such as window 20 may be formed on the rear surface of device 10, on sidewall surfaces of device 10, or elsewhere in device 10.

Optical components may be mounted within housing 12 in alignment with optical windows such a window 20. For example, discrete ambient light sensor devices, light-based proximity sensors, status indicator lights, digital image sensors, and other optical devices may be mounted under windows such as window 20. To enhance the compactness of device 10 and to enhance device aesthetics by reducing unnecessary additional optical windows, one or more ambient light sensors for device 10 may be formed using image sensor circuitry. With this type of approach, a digital image sensor may be mounted under window 20. When operated in digital image sensor mode, device 10 may obtain digital image sensor data from the image sensor. The digital image sensor data may be processed to form digital images and video clips. When operated as an ambient light detector, the same digital image sensor may be used in collecting ambient light sensor readings. Because a single image sensor can be used for both digital imaging operations and ambient light measurements, space within device 10 may be conserved and device aesthetics may be enhanced. Device cost and complexity may also be reduced.

Figure 2:
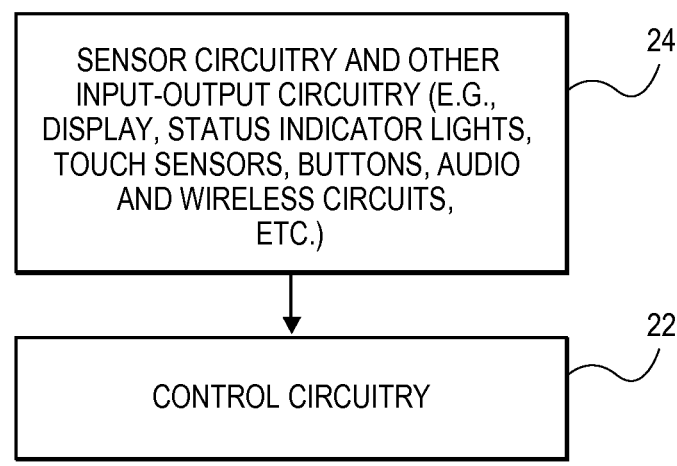
FIG. 2 is a schematic diagram of an illustrative electronic device with ambient light sensor circuitry in accordance with an embodiment of the present invention.

FIG. 2 is a schematic diagram of device 10 showing how device 10 may have control circuitry 22 and input-output circuitry such as sensor circuitry 24. Control circuitry 22 may include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 22 may also include processing circuitry based on one or more microprocessors, microcontrollers, digital signal processors, baseband processors, power management units, audio codec chips, application specific integrated circuits, etc.

The storage and processing circuitry of control circuitry 22 may be used to run software on device 10, such as internet browsing applications, voice-over-internet-protocol (VoIP) telephone call applications, email applications, media playback applications, operating system functions, software for supporting display brightness adjustment functions and other functions associated with gathering and using data from ambient light sensor circuitry and other sensors, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Input-output circuitry 24 may be used to allow data to be supplied to device 10 and to allow data to be provided from device 10 to external devices. Input-output circuitry 24 may include input-output devices such as touch screens, buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through these input-output devices and may receive status information and other output from device 10 using the output resources of these input-output devices. Wireless communications circuitry in circuitry 24 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

The sensors in circuitry 24 may include discrete ambient light sensors, proximity sensors (e.g., light-based proximity sensors that include an infrared transmitter and an infrared receiver or other light-based proximity sensor circuitry), capacitance sensors (e.g., for touch sensor and/or proximity sensing applications), force sensors (e.g., for touch sensing devices), accelerometers (e.g., an accelerometer for measuring the force of gravity and thereby determining the orientation of device 10 relative to the surface of the Earth), digital image sensors (e.g., image sensor arrays) and other sensors.

The sensors in circuitry 24 may include one more image-sensor-based ambient light detectors. Image-sensor-based ambient light detectors may be based on digital image sensor integrated circuits. Digital image sensor circuits can be used for capturing digital images or can be used to produce ambient light measurements.

The digital image sensor for an image-sensor-based ambient light sensor may be based on an image sensor array that contains rows and columns of image sensor pixels. Each image sensor pixel may contain a light sensitive element (e.g., a semiconductor-based device such as a photodiode or phototransistor) and associated support circuitry (e.g., transistors for transferring charge from the light sensitive element to a charge storage node, transistors for forming pixel-based amplifier circuitry, readout transistors for controlling the transfer of signals from the image sensor pixels to column-based readout circuitry, etc.).

To ensure accurate operation, it may be desirable to provide image-sensor-based ambient light sensor circuitry in device 10 with circuitry for calibrating the response of the light sensitive elements in the image sensor pixels. The response of the semiconductor light sensitive elements may fluctuate as a function of PVT variations (i.e., variations in fabrication process parameters (P), fluctuations in power supply voltage (V), and temperature (T) changes during operation). To prevent errors related to PVT variations, the performance of the image-sensor-based ambient light sensor circuitry may be calibrated using a set of reference light sensor elements. The reference light sensor circuitry may, as an example, be formed from the same type of light sensitive elements that are used in forming the light sensor elements in the image sensor pixels of the digital image sensor array, but may be coated with a light-blocking coating. This reference circuitry, which may sometimes be referred to as dark current reference circuitry, optically-black pixels, reference pixels, reference light sensitive elements, or reference array, may be used to make reference current measurements (i.e., dark current measurements). The amount of current that flows into the reference light sensor circuitry is affected by process, voltage, and temperature conditions, but is not influenced by the amount of ambient light that is present. Accordingly, the amount of current that is measured as flowing into the reference light sensor circuitry may be subtracted from the amount of current that is measured as flowing into the image sensor to calibrate the image sensor ambient light data.

Figure 3A:
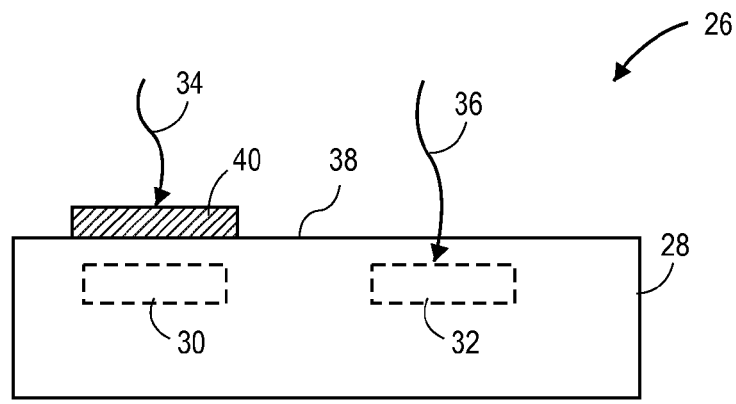
FIG. 3A is a cross-sectional side view of a semiconductor substrate showing how some light sensing devices may have a light-blocking layer for supporting dark current measurements and how some light sensing devices may be free of light-blocking material to allow light to be sensed in accordance with an embodiment of the present invention.

FIG. 3A is a cross-sectional side view of a portion of an illustrative image-sensor-based ambient light sensor integrated circuit. As shown in FIG. 3A, image-sensor-based ambient light sensor circuitry 26 may be formed from a semiconductor substrate such as substrate 28. Substrate 28 may be formed from silicon or other semiconductor materials. Light sensitive elements may be formed in substrate 28. The light sensitive elements may be formed from phototransistors, photodiodes, or other light-sensitive devices.

Some elements such as light-sensitive element 32 may be uncovered by light-blocking layers. As a result, light-sensitive elements such as element 32 may receive and measure light 36 (e.g., to form a digital image when element 32 is operated in digital image sensor mode or to gather ambient light data when element 32 is operated in ambient light sensing mode). Other elements such as reference element 30 may be covered with an opaque layer such as light-blocking structure 40. The attributes of reference elements such as reference element 30 (e.g., the size, shape, doping concentration, and other properties of the reference elements) are preferably matched to those of elements such as element 32, so that elements 30 may be used in accurately calibrating elements 32. Structures such as opaque structure 40 in each reference element 30 may be formed from metal or other opaque material. During operation, the amount of reference signal that flows into reference elements 30 will be unaffected by the strength of ambient light 34, because structure 40 will block light 34 and thereby prevent light 34 from contributing to the response of element 30.

Elements 32 may be organized into rows and columns to form an image sensor array (e.g., an image sensor array having, thousands or millions of pixels). Elements 30 may be organized into groups in the vicinity of the image sensor array. For example, elements 30 may be used to form one or more arrays that are smaller in size than the image sensor array (e.g., thin rectangular arrays running along the edge of the image sensor array). To ensure that the process, voltage, and temperature variations experienced by reference elements 30 are representative of the process, voltage, and temperature variations experienced by the image sensor array formed from elements 32, reference elements 30 may be formed adjacent to the image sensor array on substrate 28 (i.e., reference elements 30 and image sensor elements 32 may be formed as part of a common integrated circuit).

Figure 3B:
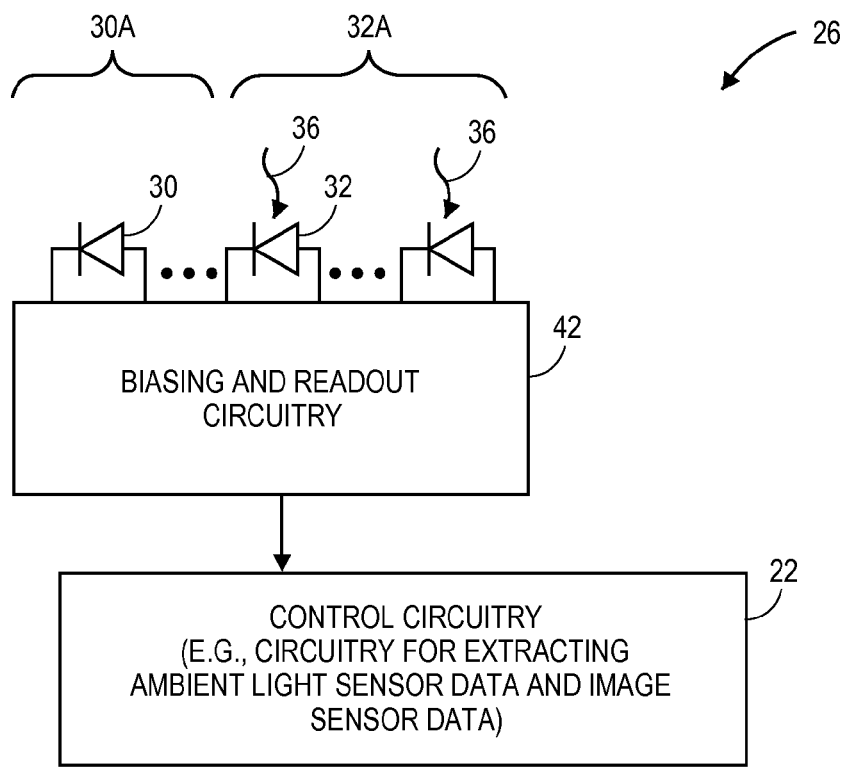
FIG. 3B is a diagram of an image sensor array formed from unblocked light sensor pixels and an associated set of blocked light sensor pixels for dark current measurements in accordance with an embodiment of the present invention.

As shown in FIG. 3B, reference elements 30 may be organized to form a set of reference sensing elements 30A (sometimes referred to as dark pixels) and light sensing elements 32 may be organized to form an adjacent image sensor array 32A. Biasing and readout circuitry 42 may be used to control the operation of reference elements 30A and image sensor array 32A. For example, when image sensor array 32A is being used as an image sensor for a digital camera, circuitry 42 may be used to capture and read out digital image data from array 32A and/or 30A. When image-sensor-based circuitry 26 is being used to make ambient light measurements, readout and biasing circuitry 42 and other control circuitry (collectively control circuitry 22) may be used to measure the amount of current that collectively flows into the light sensing elements of image sensor array 32A and, by subtracting the amount of measured dark current flowing into reference elements 30A, may calibrate the data from image sensor array 32A to produce calibrated ambient light sensor readings. Some or all of light sensing elements 32 may be used during ambient light sensing operations using array 32A (e.g., all elements in array 32A, a subset of elements in array 32A, elements in array 32A of a particular color or colors, etc.).

Figure 4:
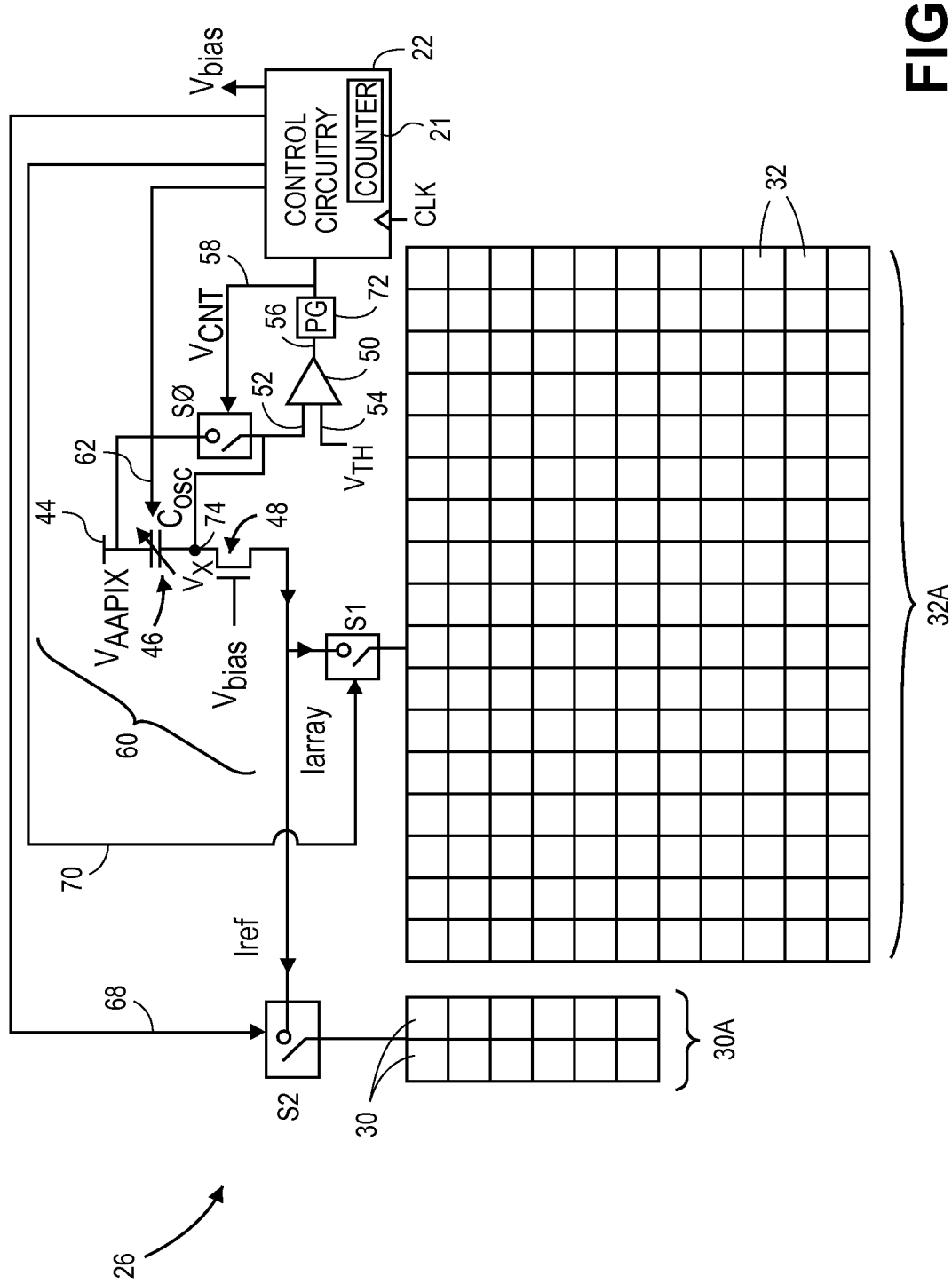
FIG. 4 is a diagram of image-sensor-based ambient light sensor circuitry of the type that may be used in accordance with an embodiment of the present invention.

FIG. 4 is a diagram of illustrative image-sensor-based ambient light sensing circuitry 26. As shown in FIG. 4, circuitry 26 may include an image sensor array such as image sensor array 32A formed from rows and columns of light sensitive elements (image sensor pixels) 32 and a set of reference pixels 30A (e.g., an array of reference elements 30). Circuitry such as current controlled oscillator circuitry 60 may be used in measuring signals from reference pixels 30A and image sensor pixels 32A. Circuitry 60 may include switches such as switches S0, S1, and S2 (e.g., transistor-based switches or other suitable switches) or other switching circuitry for controlling current flow to reference pixels 30A and image sensor pixels 32A during use of image-sensor-based ambient light sensor circuitry 26 to collect ambient light sensor data.

When switch S1 is closed and switch S2 is open, circuitry 60 may measure the magnitude of current Iarray. Current Iarray corresponds to the cumulative current drawn by a set of the image sensor pixels 32 in image sensor pixel array 32A in parallel (e.g., all of the image sensor pixels in array 32A) when image sensor array 32A is being used as an ambient light sensor. When switch S2 is closed and switch S1 is open, circuitry 60 may measure current Iref. Current Iref corresponds to the reference current (dark current) drawn by reference pixels 30A during operation of circuitry 26 as an ambient light sensor. By using circuitry 22 and circuitry 60, device 10 may calibrate the current measurements associated with array 32A using the reference current measurements associated with reference pixel array 30A.

Power supply circuitry and voltage reference circuitry (e.g., a band gap voltage reference circuit or other voltage reference circuitry that is part of control circuitry 22) may be used to supply a power supply voltage such as voltage Vaapix to power supply node 44, bias voltage Vbias for transistor 48, and threshold voltage Vth for comparator 50.

Capacitor 46 may be charged to voltage Vaapix by momentarily closing switch S0 to short node 74 to terminal 4). Capacitor 46 may then be discharged through switch S1 or switch S2. By measuring the rate at which capacitor 46 discharges when switch S1 or S2 is closed, control circuitry 22 can measure the amount of current flow through array 32A or the amount of current flow through array 30A, respectively.

The states of switches S1 and S2 may be controlled by control circuitry 22 using control signals on control paths 70 and 78, respectively. Variable capacitor 46 may exhibit a capacitance that is controlled by control signals supplied to input 62 from control circuitry 22. The capacitance Cosc of capacitor 46 may be given by equation 1.

$$Cosc = k * C0 \quad (1)$$

In equation 1, capacitance C0 is a fixed capacitance value and k is a variable scaling factor that is controlled by control circuitry 22 by application of corresponding control signals to input 62 of variable capacitor 46. Capacitance Cosc is the corresponding capacitance for capacitor 46. Control circuitry 22 can adjust the capacitance value exhibited by capacitor 46 to ensure sufficient accuracy when making current measurements (i.e., to prevent capacitor 46 from being too large and thereby discharging too slowly to effectively measure or from being too small and thereby discharging too quickly to effectively measure).

Comparator 50 may be used in monitoring the discharge of capacitor 46. As shown in FIG. 4, comparator 50 may have inputs 52 and 54. Input 54 may receive threshold voltage (reference voltage) Vth. Input 52 may receive the voltage Vx from capacitor 46 while switch S0 is open. During capacitor discharge operations, comparator 50 may compare the voltage on input 52 with the voltage on input 54 and may produce a corresponding output voltage on output 56. So long as voltage Vx is greater than voltage Vth, the signal on output 56 of comparator 50 may be deasserted (i.e., held at a logic low value). When voltage Vx falls to Vth, comparator 50 may assert its output (i.e., comparator 50 may take the signal on output line 56 high). In response, one-shot pulse generator 72 will generate an output pulse of a fixed duration. The output of pulse generator 72 (voltage Vcnt) may be provided to the control input of switch S0 using path 58. So long as output 56 is deasserted and no pulse is being generated by pulse generator 72, the value of Vcnt will be low and switch S0 will be open. In this situation, capacitor 46 may discharge and voltage Vx may fall towards Vth. Once voltage Vx reaches Vth, comparator 50 will assert the output signal on output 56, pulse generator 72 will generate an output pulse (e.g., a pulse having a positive voltage), and switch S0 will be closed (i.e., for the duration of the output pulse from pulse generator 72).

When S0 is momentarily closed in this way, voltage supply terminal 44 at voltage Vaapix will be shorted to node 74, capacitor 46 will be charged, and capacitor voltage Vx will be raised to Vaapix. After recharging capacitor 46 in this way, capacitor 46 can be discharged through array 32A using closed switch S1 and open switch S2 or can be discharged through array 30A using closed switch S2 and open switch S1, as appropriate.

When switch S2 is closed and switch S1 is open, the amount of current Iref that is drawn from capacitor 46 will be equal to cumulative dark current of all of the dark (optically black) pixels 30 in reference pixels 30A. When switch S1 is closed and switch S2 is open, the amount of current Iarray that is drawn from capacitor 46 will be equal to the cumulative current of the pixels in array 32A (or a selected subset of these pixels). The value of Iarray includes a current contribution due to the detection of ambient light and includes a dark current contribution. To calibrate image-sensor-based ambient light sensor circuitry 26, control circuitry 22 may subtract a scaled version of the reference current measured by reference pixels 30A (Iref) from the measured value of Iarray.

Control circuitry 22 may be used in measuring the values of currents Iref and Iarray. To make a current measurement, control circuitry 22 can receive a clock signal such as clock CLK. Using a counter such as counter 21 or other suitable circuit that is driven by clock signal CLK, control circuitry 22 may measure the amount of time between successive changes in the state of signal Vcnt. These measurements are indicative of the decay time associated with discharging capacitor 46 from Vaapix to Vth and are therefore indicative of the magnitudes of currents such as currents Iref and Iarray.

Figure 5:
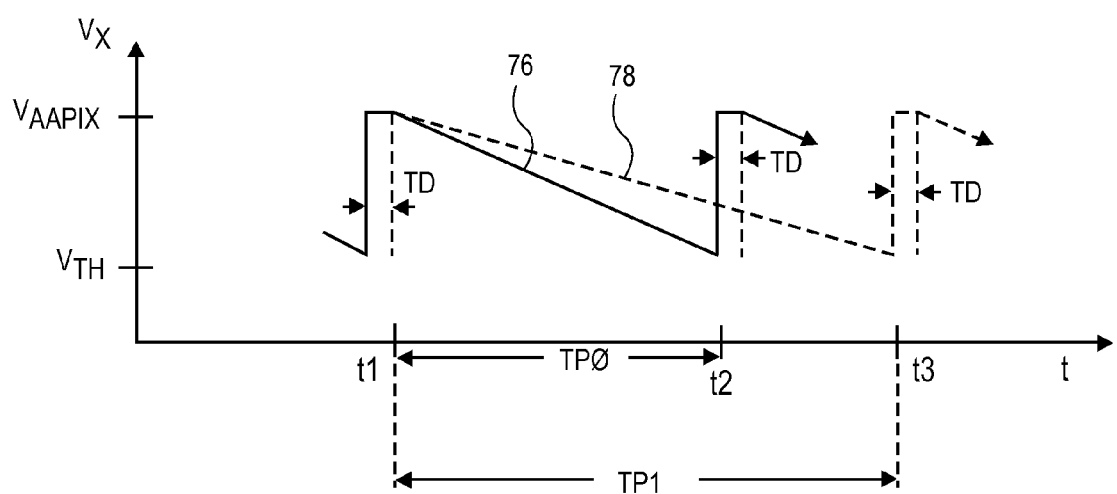
FIG. 5 is a signal trace associated with the measurement of sensor current during operation of the image-sensor-based ambient light sensor circuitry of FIG. 4 in accordance with an embodiment of the present invention.

Consider, as an example, the trace of voltage Vx that is shown in the graph of FIG. 5. In the example of FIG. 5, curve 76 corresponds to the discharge of capacitor 46 when a current of a first magnitude is being drawn. Curve 78 corresponds to the voltage on discharging capacitor 46 when a current of a second magnitude that is smaller than the first magnitude is being drawn.

As shown in FIG. 5, the voltage Vx on capacitor 46 is reset to Vaapix at time t1, following application of a pulse of duration TD from pulse generator 72 to switch S0. Starting at time t1, current is drawn from capacitor 46 by pixels in array 32A or by pixels in array 30A, depending on whether control circuitry 22 has closed switch S1 and opened switch S2 or vice versa.

As shown by curve 76, when the current of the first magnitude is drawn from capacitor 46, voltage Vx will fall to voltage Vth at time t2. When comparator 50 senses that Vx has fallen below Vth, comparator 50 will take its output on line 56 high and pulse generator 72 will again generate a momentary pulse of length TD for switch S0 to reset the voltage Vx on capacitor 46 to Vaapix. This process may repeat, so that control circuitry 22 may make a series of measurements (e.g., to average data or otherwise process data to enhance accuracy).

If the current being drawn from the capacitor has the second magnitude, the voltage Vx will decrease slower, as indicated by curve 78. As a result, voltage Vx will not reach voltage Vth until time t3.

Control circuitry 22 may use a counter or other circuitry for measuring the duration of the Vaapix to Vth decay time. In the example of FIG. 5, the current that resulted in voltage decay curve 76 is associated with a time period TP0, whereas the current that resulted in voltage decay curve 78 is associated with a time period TP1. Control circuitry 22 may measure decay periods such as TP0 and TP1 (e.g., using a counter or other timing circuitry) and can convert the measured decay time (i.e., the time between successive pulses output from pulse generator 72) to measured current values. Using this type of technique, control circuitry 22 may measure array current Iarray and reference current Iref. The values of these measured currents may, in turn, be processed (e.g., using digital processing techniques implemented using control circuitry 22), to produce calibrated ambient light data.

Figure 6:
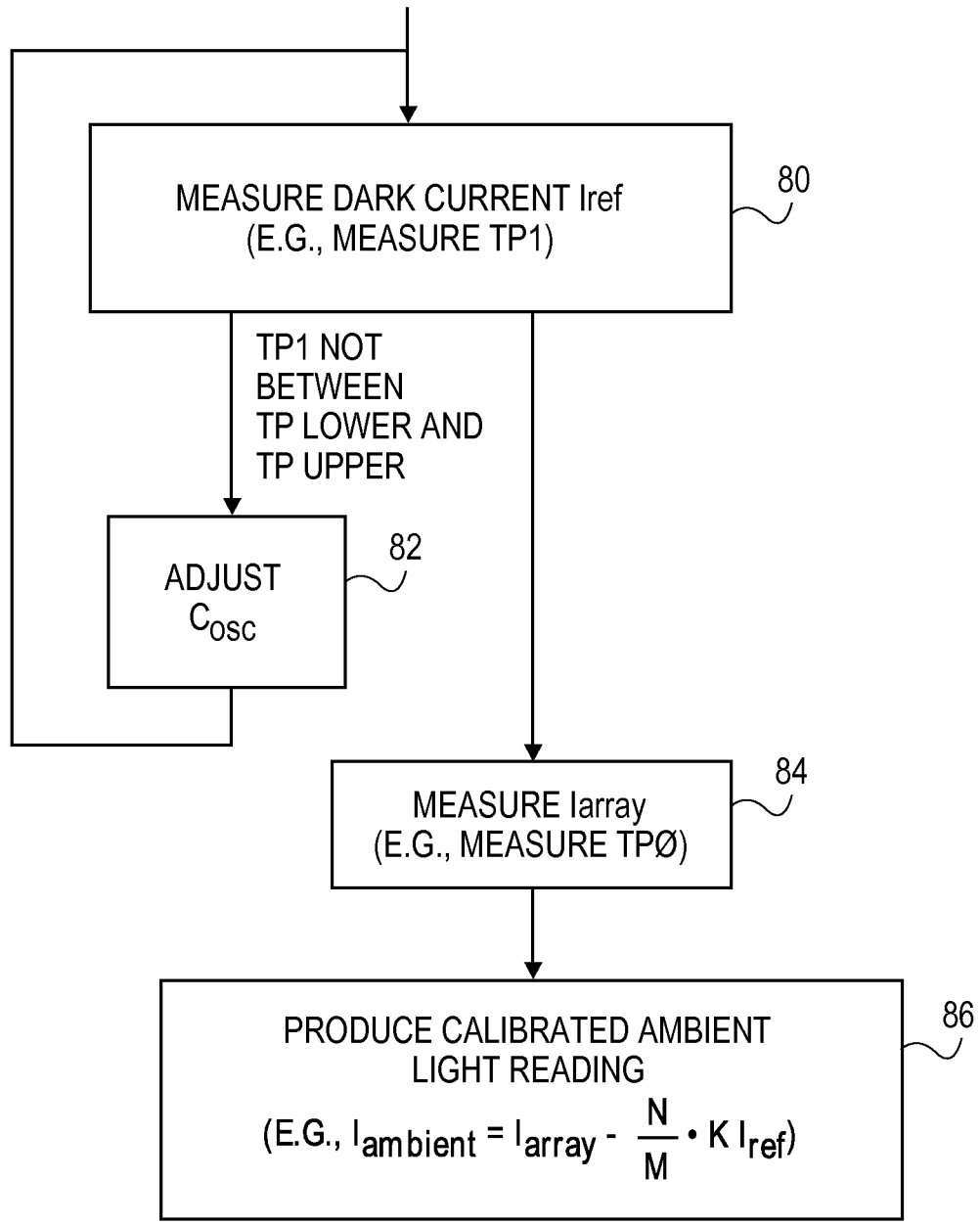
FIG. 6 is a flow chart of illustrative steps involved in gathering a calibrated ambient light sensor reading representative of an ambient light level using image-sensor-based ambient light sensor circuitry in accordance with an embodiment of the present invention.
Figure 7:
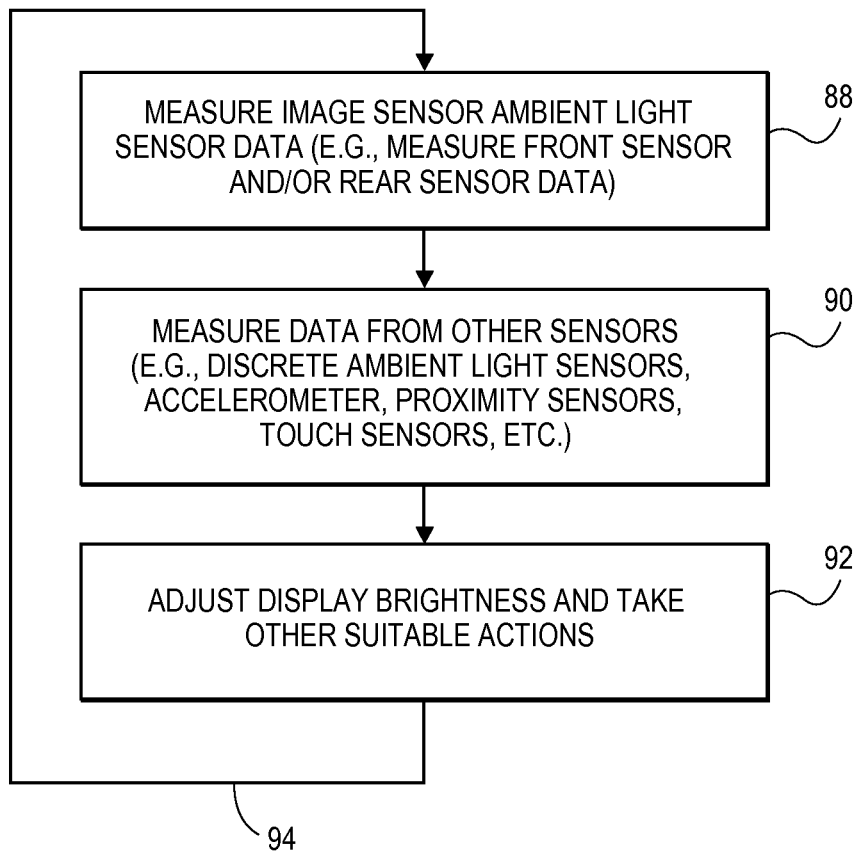
FIG. 7 is a flow chart of illustrative steps involved in gathering and using ambient light sensor data and other sensor data during operation of an electronic device of the type shown in FIG. 1 in accordance with an embodiment of the present invention.

A flow chart of illustrative steps involved in using image-sensor-based ambient light sensor circuitry 26 to make an ambient light sensor reading representative of an ambient light level to which the sensor circuitry is exposed is shown in FIG. 6. At step 80, control circuitry 22 may measure dark current Iref associated with reference pixels 30 in reference pixel array 30A. During these measurements, control circuitry 22 may supply switches S2 and S1 with control signals to close switch S2 and open switch S1.

Initially, the value of k (i.e., the value of capacitor Cosc) may be set to a default value. If the value of capacitance Cosc is too low, the decay period TP of voltage Vx will be too short to effectively measure using control circuitry 22. If the value of capacitance Cosc is too high, the decay period TP of voltage Vx will be too long to effectively measure using control circuitry 22. Accordingly, control circuitry 22 may, during the operations of step 80, ascertain whether decay period TP is greater to a predetermined satisfactory lower decay time threshold TPLOWER and less than a predetermined satisfactory upper decay time threshold TPUPPER. If the measured decay time TP is not within this range, control circuitry 22 may adjust k to increase or decrease Cosc as appropriate. The measurement operations of step 80 may then be repeated with the newly selected value of k (and the corresponding newly selected value of Cosc).

Once a satisfactory k value and Cosc value have been selected, the resulting measured value of TP will fall within an acceptable range that allows control circuitry 22 to make accurate measurements. Accordingly, the value of TP associated with reference current Iref (and the corresponding value of k) may be retained by control circuitry 22 for use in calibration operations. Processing may then proceed to step 84, where control circuitry 22 may measure the current Iarray that is associated with pixels 32 of image sensor array 32A (e.g., using a value of k=1 or using a default value of Cosc that is appropriate for making Iarray measurements).

The value of Iarray is equal to the sum of an ambient light contribution (i.e., a current component due to the magnitude of ambient light received by pixels 32) and a dark current contribution. The dark current contribution may be affected by PVT variations. For example, changes in operating temperature for image sensor array 32A may have a significant impact on the magnitude of Iarray. The pixels in array 30A are likewise affected by PVT variations, but because the reference pixels in array 30A are optically blocked and do not receive light, the reference pixels in array 30A are not affected by changes in the amount of ambient light that is present. To calibrate Iarray and thereby produce an accurate ambient light reading, control circuitry 22 may, at step 86, compute the value of calibrated current Iambient using equation 2.

$$Iambient = Iarray - (N*k/M)*Iref \quad (2)$$

In equation 2, Iambient corresponds to a calibrated current value that is proportional to the amount of ambient light detected by image-sensor-based ambient light sensor 26. Current Iarray is the measured current drawn by N light sensor elements (i.e., N pixels) in array 32A as measured using circuitry 60 and circuitry 22. Current Iref is the measured current drawn by M reference pixels 30A in reference pixel array 30A as measured using circuitry 60 and circuitry 22. The scaling factor k corresponds to the size of capacitor 46 that was selected during the operations of step 82, assuming that k was 1 during the operations of step 84. If k has a value other than 1 during the operations of step 84, k in equation 2 may be set to the ratio of Cosc during step 80 to Cosc during step 84.

By scaling the value of Iref using equation 2, control circuitry 22 can compensate for the smaller size of array 30A relative to array 32A and the settings used for adjustable capacitor 46 when computing calibrated ambient light current Iambient. Calibrated current Iambient serves as an accurate ambient light reading for device 10 and may be used in taking any suitable action in device 10. For example, device 10 may use the value of Iambient in determining whether to increase and/or decrease the brightness of display 14. The measurement process of FIG. 6 may be performed multiple times to produce averaged ambient light data (e.g., data that is processed using a digital low-pass filter and/or other signal processing techniques).

If desired, device 10 may use ambient light data from one or more image-sensor-based ambient light sensors in conjunction with additional sensor data in determining how to control the operation of device 10. A flow chart of illustrative operations associated with controlling device 10 using multiple sensor inputs of this type is shown in FIG. 6.

At step 88, device 10 may use image-sensor-based ambient light sensor circuitry 26 to make ambient light sensor measurements. One or more image-sensor-based ambient light detectors may be used in gathering ambient light readings. For example, in an electronic device that has both front-facing and rear-facing digital cameras, a front-mounted sensor circuit may be used to gather front-facing ambient light data and/or a rear-mounted sensor circuit may be used to gather rear-facing ambient light data.

At step 90, device 10 may use additional sensors to gather sensor readings such as accelerometer readings to determine whether device 10 is face up or face down or has another orientation relative to the surface of the Earth, proximity sensor readings to determine whether ambient light sensor data may have been corrupted by shadows due to external objects in the vicinity of the image-sensor-based ambient light detector(s), data from touch sensors indicating whether or not a user is using a touch screen on the front (or rear) of a device, and data from other sensors.

At step 92, control circuitry 22 may take appropriate action based on one or more of the sensor readings gathered during the operations of steps 88 and 90. If, for example, the rear ambient light sensor is darker than the front ambient light sensor reading and accelerometer data and touch sensor data indicate that device 10 is facing upwards and is being used by a user, the ambient light sensor data from the rear ambient light sensor can be considered to be inaccurate (because the rear camera is being shadowed by being placed on a table or in a user's hand). Control circuitry 22 may therefore discard the rear ambient light sensor data (in this example).

Following adjustment of display brightness or other suitable actions, processing may return to step 88, as indicated by line 94.

The foregoing is merely illustrative of the principles of this invention and various modifications can be made by those skilled in the art without departing from the scope and spirit of the invention.

What is claimed is:

1. Image-sensor-based ambient light sensing circuitry, comprising:
   an image sensor array;
   an optically-black reference sensor array; and
   control circuitry that produces an ambient light sensor reading based on data from the image sensor array and the reference sensor array, wherein the control circuitry is configured to measure current flow into the image sensor array and the reference light sensor array and is configured to produce the ambient light sensor reading based at least partly on how much current flows into the reference sensor array and how much current flows into the image sensor array.

2. The image-sensor-based ambient light sensing circuitry defined in claim 1 wherein the control circuitry includes a capacitor and wherein the control circuitry is configured to discharge the capacitor into the image sensor array to measure current flow into the image sensor array, and is configured to discharge the capacitor into the reference sensor array to measure current flow into the reference sensor array.

3. The image-sensor-based ambient light sensing circuitry defined in claim 2 wherein the reference sensor array comprises a plurality of light sensor elements that are covered with a light blocking material to prevent ambient light from reaching the light sensor elements.

4. The image-sensor-based ambient light sensing circuitry defined in claim 3 wherein the image sensor array has M light sensing elements, wherein the reference light sensor array has N light sensing elements that are covered with the light blocking material, and wherein the control circuitry is configured to produce the ambient light sensor reading based at least partly on the ratio of M to N.

5. The image-sensor-based ambient light sensing circuitry defined in claim 2 wherein the capacitor comprises a variable capacitor that is adjusted by the control circuitry.

6. The image-sensor-based ambient light sensing circuitry defined in claim 5 wherein the control circuitry is configured to adjust the variable capacitor to ensure accuracy in performing current flow measurements.

7. The image-sensor-based ambient light sensing circuitry defined in claim 2 wherein the control circuitry comprises a counter for measuring a voltage decay time associated with discharge of the capacitor during current flow measurements.

8. The image-sensor-based ambient light sensing circuitry defined in claim 2 further comprising at least a first switch and a second switch, wherein the control circuitry is configured to discharge the capacitor into the image sensor array during measurement of current flow into the image sensor array by closing the first switch and opening the second switch and is configured to discharge the capacitor into the reference light sensor array during measurement of current flow into the reference light sensor array by closing the second switch and opening the first switch.

9. The image-sensor-based ambient light sensing circuitry defined in claim 2 wherein the control circuitry comprises a switch that bridges the capacitor.

10. The image-sensor-based ambient light sensing circuitry defined in claim 9 wherein the control circuitry is configured to close the switch to charge the capacitor.

11. The image-sensor-based ambient light sensing circuitry defined in claim 9 wherein the control circuitry includes a comparator that compares a capacitor voltage associated with the capacitor to a threshold voltage.

12. The image-sensor-based ambient light sensing circuitry defined in claim 11 wherein the control circuitry includes a pulse generator.

13. The image-sensor-based ambient light sensing circuitry defined in claim 2 wherein the control circuitry comprises:
  a switch that bridges the capacitor; and
  a pulse generator having an output that supplies a control signal to the switch.

14. A method of calibrating image-sensor-based ambient light sensor circuitry, comprising:
  closing a second switch to supply current to an image sensor;
  while the second switch is closed, measuring an image sensor current for the image sensor while the image sensor is exposed to ambient light at an ambient light level;
  opening the second switch and closing a first switch to supply current to a reference array of light sensor elements that are covered with light blocking material;
  while the first switch is closed, measuring a reference current for the reference array; and
  producing an ambient light reading representative of the ambient light level based at least partly on the measured image sensor current and the measured reference current.

15. The method defined in claim 14 wherein the image-sensor-based ambient light sensor circuitry comprises a capacitor and wherein measuring the image sensor current and the reference current comprises monitoring a capacitor voltage associated with the capacitor as the capacitor is discharged.

16. The method defined in claim 15 wherein monitoring the capacitor voltage comprises using a counter to measure a voltage decay time associated with discharging the capacitor from a first predetermined voltage to a second predetermined voltage.

17. The method defined in claim 15 wherein the image-sensor-based ambient light sensor circuitry comprises a third switch, the method further comprising:
  charging the capacitor to a predetermined voltage by closing the third switch.

18. The method defined in claim 17 wherein the capacitor comprises a variable capacitor, the method further comprising adjusting the variable capacitor using the control circuitry.

* * * * *